(12) United States Patent
Wu et al.

(10) Patent No.: US 6,215,151 B1
(45) Date of Patent: *Apr. 10, 2001

(54) METHODS OF FORMING INTEGRATED CIRCUITRY AND INTEGRATED CIRCUITRY

(75) Inventors: Zhiqiang Wu; Luan C. Tran, both of Meridian; Robert Kerr, Boise; Shubneesh Batra, Boise; Rongsheng Yang, Boise, all of ID (US)

(73) Assignee: Micron Technology, Inc., Boise, ID (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/255,667

(22) Filed: Feb. 23, 1999

Related U.S. Application Data

(62) Division of application No. 08/912,108, filed on Aug. 4, 1997, now Pat. No. 5,946,564.

(51) Int. Cl.$^7$ .................. H01L 27/148; H01L 29/768
(52) U.S. Cl. .................. 257/336; 257/336; 257/344; 257/204; 438/376; 438/546; 438/501; 438/199; 438/217
(58) Field of Search ..................... 257/336, 344, 257/408, 204; 438/377, 546, 376, 510, 217, 199

(56) References Cited

U.S. PATENT DOCUMENTS

| | | |
|---|---|---|
| 4,956,306 | 9/1990 | Fuller et al. . |
| 5,045,495 | 9/1991 | Teague et al. . |
| 5,416,038 | 5/1995 | Hsue et al. . |
| 5,478,761 | 12/1995 | Komori et al. . |
| 5,498,553 | 3/1996 | Yang . |
| 5,534,449 | 7/1996 | Dennison et al. ............... 437/34 |
| 5,696,016 | 12/1997 | Chen et al. . |
| 5,728,612 | 3/1998 | Wei et al. . |

(List continued on next page.)

OTHER PUBLICATIONS

S. Wolf, *Silicon Processing for the VLSI Era—vol. 2: Process Integration* (Lattice Press 1990), pp. 381–392.

(List continued on next page.)

*Primary Examiner*—Matthew Smith
*Assistant Examiner*—Granvill D Lee, Jr.
(74) *Attorney, Agent, or Firm*—Wells, St. John, Roberts, Gregory & Matkin P.S.

(57) ABSTRACT

Integrated circuitry and methods of forming integrated circuitry are described. In one implementation, a common masking step is utilized to provide source/drain diffusion regions and halo ion implantation or dopant regions relative to the source/drain regions within one well region of a substrate; and well contact diffusion regions within another well region of the substrate. The common masking step preferably defines at least one mask opening over the substrate within which the well contact diffusion region is to be formed, and the mask opening is suitably dimensioned to reduce the amount of halo ion implantation dopant which ultimately reaches the substrate therebelow. According to one aspect, a plurality of mask openings are provided. According to another aspect, a suitably-dimensioned single mask opening is provided. In yet another aspect, a unique well region construction is provided with one or more complementary mask openings which is (are) configured to, in connection with the provision of the halo ion implantation dopant, block the amount of implantation dopant which ultimately reaches the substrate adjacent the well contact diffusion regions. Accordingly, at least some of the well contact diffusion region(s) remain in substantial contact with the well region after the doping of the substrate with the halo ion implantation dopant.

29 Claims, 7 Drawing Sheets

U.S. PATENT DOCUMENTS

| | | |
|---|---|---|
| 5,736,445 | 4/1998 | Pfirsch . |
| 5,827,763 | 10/1998 | Gardner et al. . |
| 5,849,615 * | 12/1998 | Ahmad et al. ............. 438/302 |
| 5,877,049 | 3/1999 | Liu et al. . |
| 5,880,014 | 3/1999 | Park et al. . |
| 5,952,696 * | 9/1999 | Gardner et al. ............. 257/369 |
| 6,071,767 * | 6/2000 | Monkowski et al. ............. 438/202 |

OTHER PUBLICATIONS

*Experimentally Charaterizing Punchthrough*, S. Wolf, Silicon Processing For The VLSI Era, vol. III, Chap. 5.3.1, pp. 240 & 387.

Wolf, S,. *Silicon Processing For The VLSI Era*, vol. III, Chap. 5.3.1—"Experimentally Characterizing Punchthrough", pp. 240 and 387.

* cited by examiner

US 6,215,151 B1

METHODS OF FORMING INTEGRATED CIRCUITRY AND INTEGRATED CIRCUITRY

RELATED PATENT DATA

This patent resulted from a divisional application of U.S. patent application Ser. No. 08/912,108, filed Aug. 4, 1997, entitled "Methods of Forming Integrated Circuitry and Integrated Circuitry", naming Zhiqiang Wu et al. as inventors, and which is now U.S. Pat. No. 5,946,564 the disclosure of which is incorporated by reference.

TECHNICAL FIELD

This invention relates to methods of forming integrated circuitry and to related integrated circuitry.

BACKGROUND OF THE INVENTION

An MOS (metal-oxide-semiconductor) structure in semiconductor processing is created by superimposing several layers of conducting, insulating and transistor forming materials. After a series of processing steps, a typical structure might comprise levels of diffusion, polysilicon and metal that are separated by insulating layers. Integrated circuitry can employ different types of MOS structures or transistors which are formed on a common substrate. NMOS transistors include source/drain diffusion regions which comprise an n-type dopant. PMOS transistors include source/drain diffusion regions which comprise an p-type dopant. CMOS (complementary metal-oxide-semiconductor) is so-named because it uses two types of transistors, namely an n-type transistor (NMOS) and a p-type transistor (PMOS). These are fabricated in a semiconductor substrate, typically silicon, by using either negatively doped silicon that is rich in electrons or positively doped silicon that is rich in holes. Different dopant ions are utilized for doping the desired substrate regions with the desired concentration of produced holes or electrons.

NMOS remained the dominant MOS technology as long as the integration level devices on a chip was sufficiently low. It is comparatively inexpensive to fabricate, very functionally dense, and faster than PMOS. With the dawning of large scale integration, however, power consumption in NMOS circuits began to exceed tolerable limits. CMOS represented a lower-power technology capable of exploiting large scale integration fabrication techniques.

CMOS fabrication does however present a number of challenges to the fabricator as compared to using PMOS or NMOS alone. Specifically, typically independent or separate masking steps are utilized for masking one of the p-type regions while the n-type region is being doped. Also, the n-type regions are separately masked when the p-type regions are being doped. Accordingly, typical transistor flows use one mask each to form the n-channel and p-channel transistor source and drain regions. Higher levels of integration result in denser and denser circuits, leading CMOS fabrication to more difficulties. One manner of simplifying transistor flows has been to combine masking steps. This in itself presents unique challenges which this invention addresses.

It would be desirable to develop methods which further facilitate formation of integrated circuitry devices. It would also be desirable to develop methods which further facilitate formation of NMOS and PMOS devices.

SUMMARY OF THE INVENTION

Integrated circuitry and methods of forming integrated circuitry are described. In one implementation, a common masking step is utilized to provide source/drain diffusion regions and halo ion implantation or dopant regions relative to the source/drain regions within one well region of a substrate; and well contact diffusion regions within another well region of the substrate. The common masking step preferably defines at least one mask opening over the substrate within which the well contact diffusion region is to be formed, and the mask opening is suitably dimensioned to reduce the amount of halo ion implantation dopant which ultimately reaches the substrate therebelow. According to one aspect, a plurality of mask openings are provided. According to another aspect, a suitably-dimensioned single mask opening is provided. In yet another aspect, a unique well region construction is provided with one or more complementary mask openings which is (are) configured to, in connection with the provision of the halo ion implantation dopant, block the amount of implantation dopant which ultimately reaches the substrate adjacent the well contact diffusion regions. Accordingly, at least some of the well contact diffusion region(s) remain in substantial contact with the well region after the doping of the substrate with the halo ion implantation dopant.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
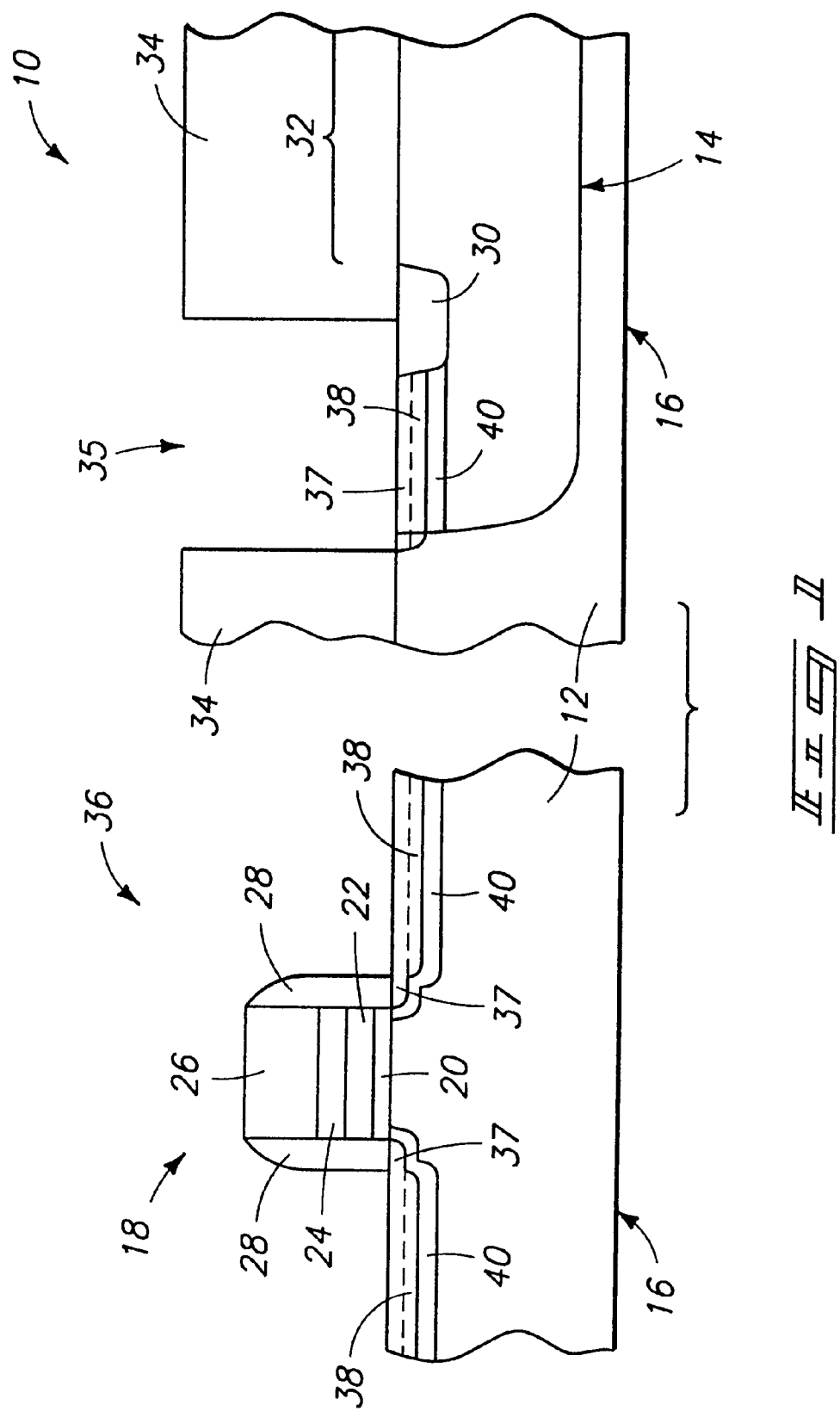
FIG. 1 is a diagrammatic sectional view of a semiconductor wafer fragment at one processing step.

Referring to FIG. 1, portions of a semiconductor wafer fragment in process are indicated generally with reference numeral 10. Such comprises a bulk semiconductive substrate 12. In the context of this document, the term 'semiconductive substrate is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

In a preferred implementation, substrate 12 comprises a first well region 14 and an adjacent second well region 16.

According to one aspect, substrate 12 comprises an intrinsically p-type doped substrate and first well region 14 comprises an n-well or well region which is formed through suitable provision of n-type dopant into the substrate. Accordingly, second well region 16 can comprise the intrinsically p-type doped substrate. Alternately, p-type dopant can be separately provided into the substrate adjacent first well region 14 to form second well region 16. A conductive line 18 is formed over substrate 12 and relative to second well region 16. In an exemplary and preferred aspect, conductive line 18 constitutes a portion of NMOS circuitry. Similar conductive lines having associated source/drain diffusion regions are formed over or relative to well region 14, but for purposes of brevity are not specifically shown. Such conductive lines over well region 14 constitute, in accordance with this aspect of the invention, PMOS circuitry which is supported by the well region. Typically, conductive lines such as conductive gate line 18 include a thin oxide layer 20, a conductive polysilicon layer 22, a conductive silicide layer 24 and an insulative cap 26. Such lines are typically provided with insulative sidewall spacers 28 as shown. Such constitutes only an exemplary conductive line construction.

Figure 2:
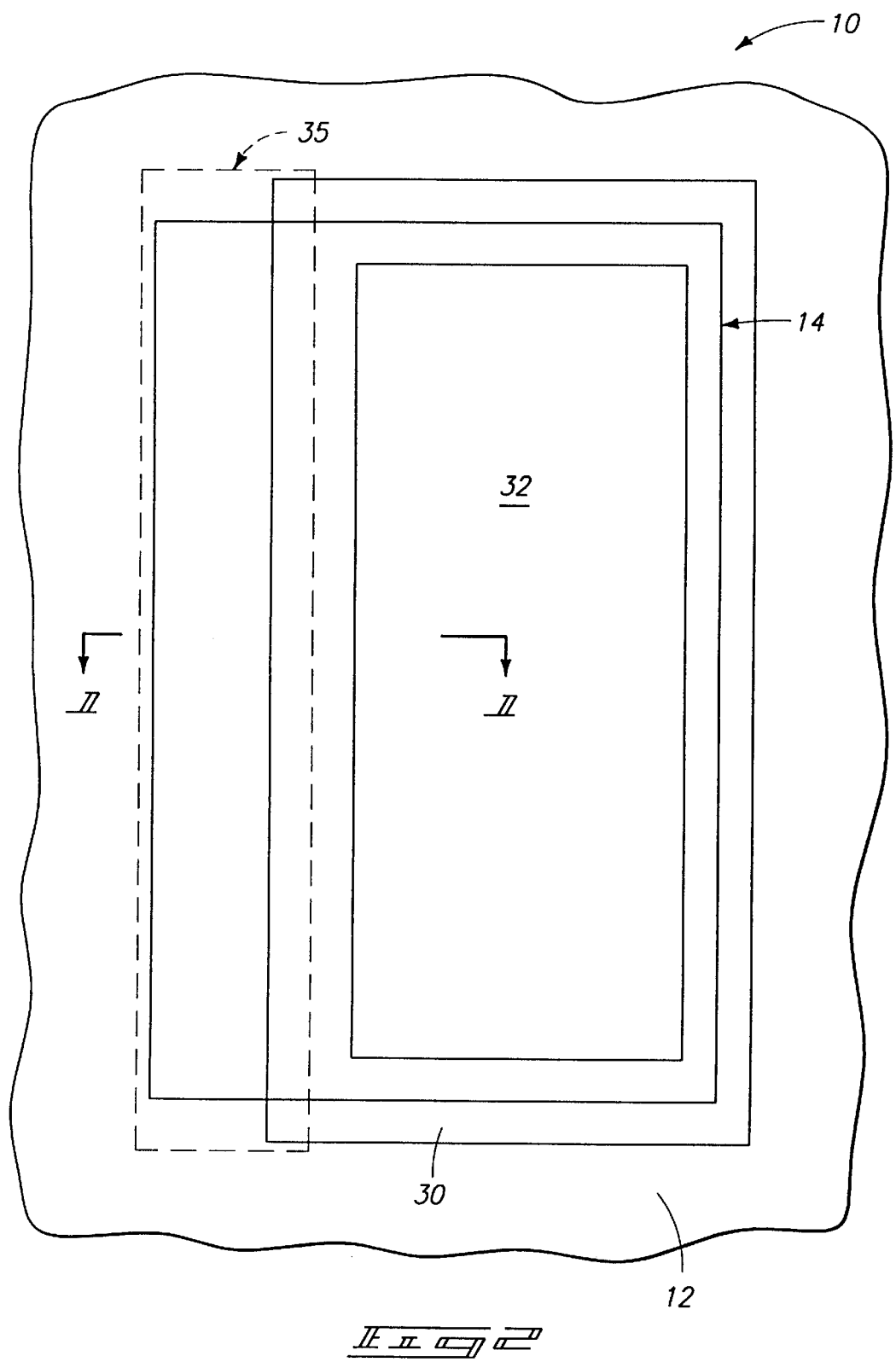
FIG. 2 is a top plan view of a portion of the FIG. 1 wafer fragment.

Referring to FIGS. 1 and 2, an isolation oxide region 30 is formed relative to substrate 12. A portion of isolation oxide region 30 is shown in FIG. 1 laterally spaced from p-type well region 16. An active area 32 constitutes an area relative to which PMOS circuitry or devices, such as the conductive lines mentioned above, are to be formed. Masking steps are ideally combined to reduce the number of processing steps in a particular processing flow. For example, it is desired to use a common masking step to form source/drain diffusion regions and the heavily doped diffusion or tie contact to an opposing well region. Accordingly, a masking material 34 (FIG. 1), such as photoresist, is provided over substrate 12 and patterned to define mask openings 35, 36 relative thereto. For purposes of the ongoing discussion, mask opening 35 over well region 14 constitutes a first mask opening or openings, and mask opening 36 over well region 16 constitutes a second mask opening or openings. Accordingly, such constitutes a common masking step in which the substrate is masked relative to first and second well regions 14, 16 respectively. Lightly doped drain regions (LDDs) 37 are provided and can typically be formed in advance of the illustrated sidewall spacers 28. An amount of LDD dopant is also received within well region 14.

A first conductivity type impurity is provided into the substrate through mask openings 36 to form source/drain diffusion regions 38 relative to the NMOS device in unmasked portions of well region 16, and well contact diffusion regions 38 relative to well region 14. In this exemplary implementation, the first conductivity type impurity constitutes an n-type impurity. A second conductivity type impurity is also provided into the substrate through the common mask openings and constitutes p-type halo ion implant regions 40 which are received within well region 16 relative to the NMOS devices. An exemplary p-type dopant is boron. Of course, the provision of the second conductivity type impurity can take place prior to provision of the first conductivity type impurity.

A problem stemming from the use of a common masking step is that such can also undesirably enable the illustrated p-type diffusion regions 40 to form within well region 14. While the p-type diffusion regions 40 are desirable relative to the illustrated NMOS conductive line 18, such regions are not desirable relative to the PMOS devices of well region 14. Such undesirable regions can entirely occupy space between well contact diffusion region 38 and well region 14, and can extend laterally from well region 16 to isolation oxide 30. Accordingly, desirable electrical connection of well contact diffusion region 38 relative to well region 14 is made more difficult because of the presence of p-type diffusion region 40.

Figure 3:
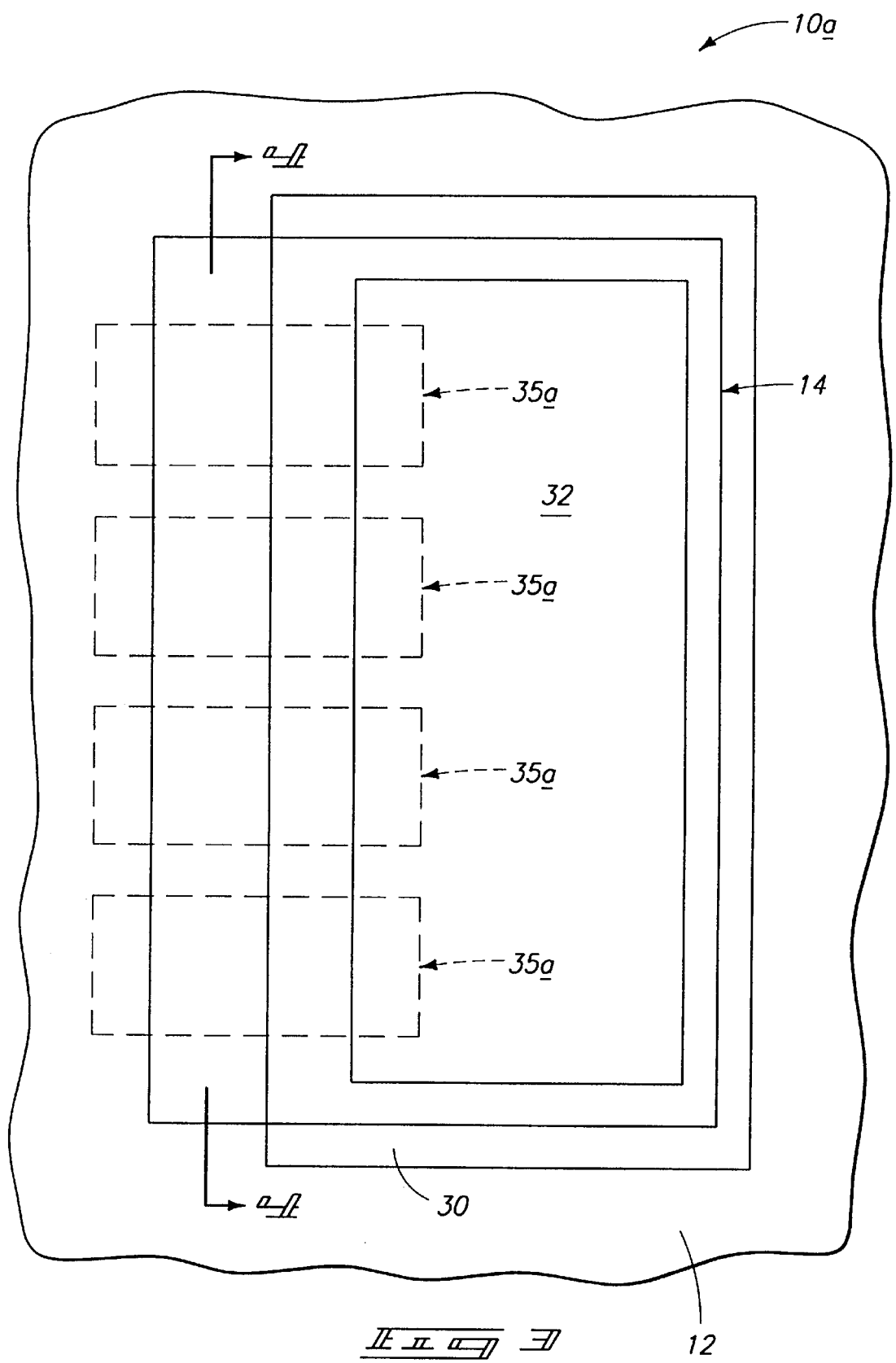
FIG. 3 is a top plan view of a semiconductor wafer fragment at one processing step in accordance with one preferred embodiment of the invention.
Figure 4:
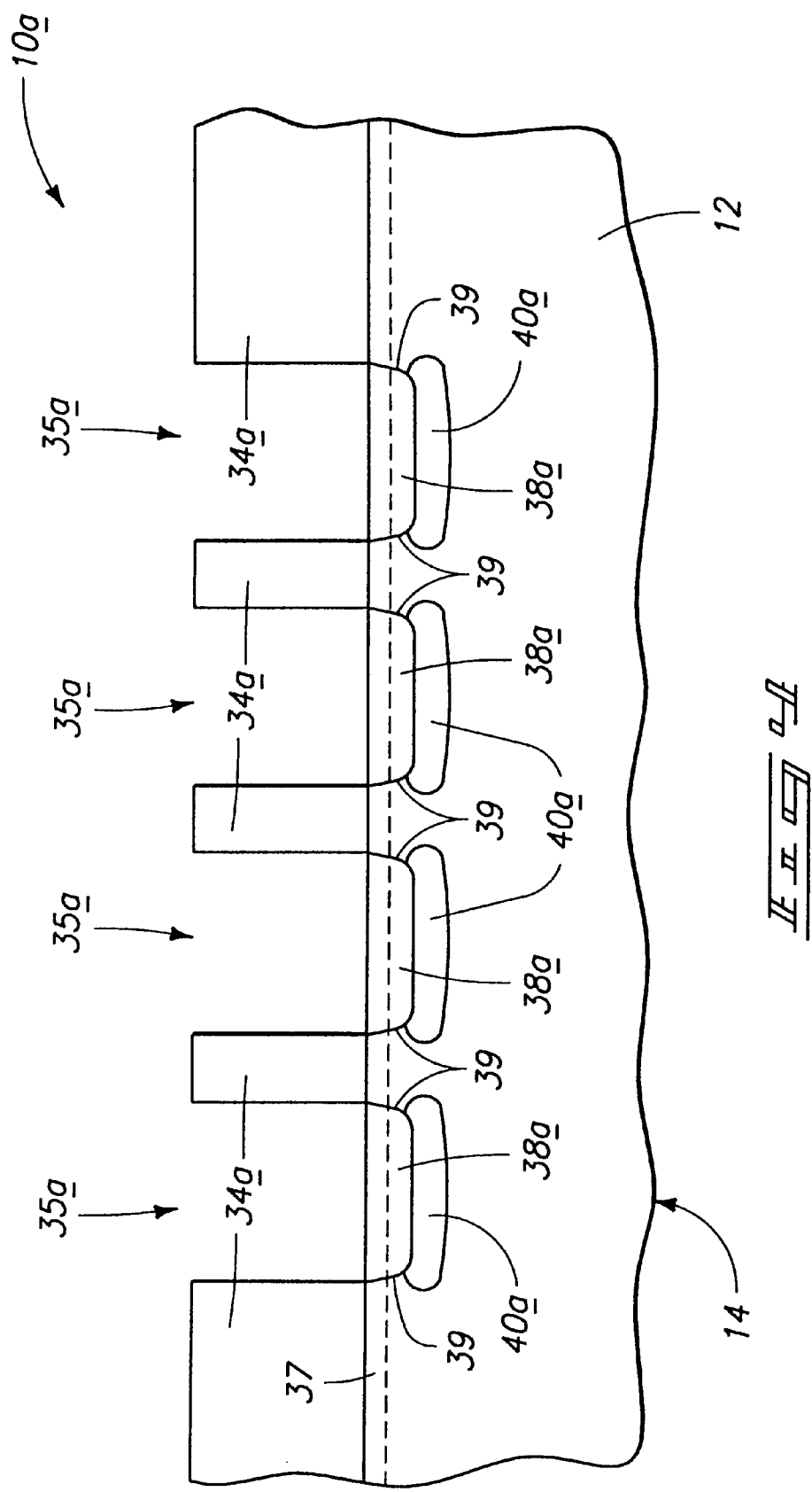
FIG. 4 is a view taken along line 4—4 in FIG. 3.

Referring to FIGS. 3 and 4, one preferred aspect of the invention is set forth. Like numbers from the above-described embodiment are utilized where appropriate, with differences being indicated with the suffix "a" or with different numerals. Accordingly, and in a common masking step, substrate 12 is masked relative to first and second well regions 14, 16. Such defines at least two, and preferably more, spaced apart mask openings 35a relative to first well region 14. As best seen in FIG. 3, the illustrated mask openings 35a individually extend from active area 32, over isolation oxide region 30, over well region 14 and into a portion of substrate 12 which comprises well region 16 (not specifically designated). First mask openings 36 (FIG. 1) are also provided over well region 16 as in the example above. With the mask openings 35a, 36 in place, first conductivity type impurity is provided into substrate 12 thereby doping the substrate through the respective mask openings. Accordingly, at least two well contact diffusion regions 38a (FIG. 4) are formed within well region 14. Such also desirably forms the FIG. 1 source/drain diffusion regions 38. Second conductivity type impurity is provided into the substrate to provide the halo ion implantation regions 40 of FIG. 1. Some of the second conductivity type impurity is provided through mask openings 35a and forms dopant regions 40a within well region 14.

According to one aspect of the invention, dopant regions 40a have individual average dopant depths within the substrate which are different from those of well contact diffusion regions 38a in well region 14 and source/drain regions 38 in well region 16 (FIG. 1). The difference in average dopant depth between well contact diffusion regions 38a and regions 40a, together with the plurality of well contact diffusion regions ensures that at least some portions of the individual well or tie contact diffusion regions remain in substantial physical contact with their associated well regions. Exemplary portions in such physical contact are illustrated at 39 and constitute sidewall portions of the individual well contact diffusion regions. Hence, electrical contact between individual well contact diffusion regions and the associated well region in which each is formed is, better achieved after the second conductivity type doping. In the illustrated example, the average dopant depths of the second conductivity type dopant regions 40a are greater than those of well contact diffusion regions 38a (FIG. 4). The average dopant depth of the second conductivity type dopant can, however, be less than the average dopant depth of well contact diffusion regions 38a as discussed in more detail below.

The masking of substrate 12 in the embodiment just described, defines a plurality of discrete mask openings 35a which are not interconnected within first well region 14.

Figure 5:
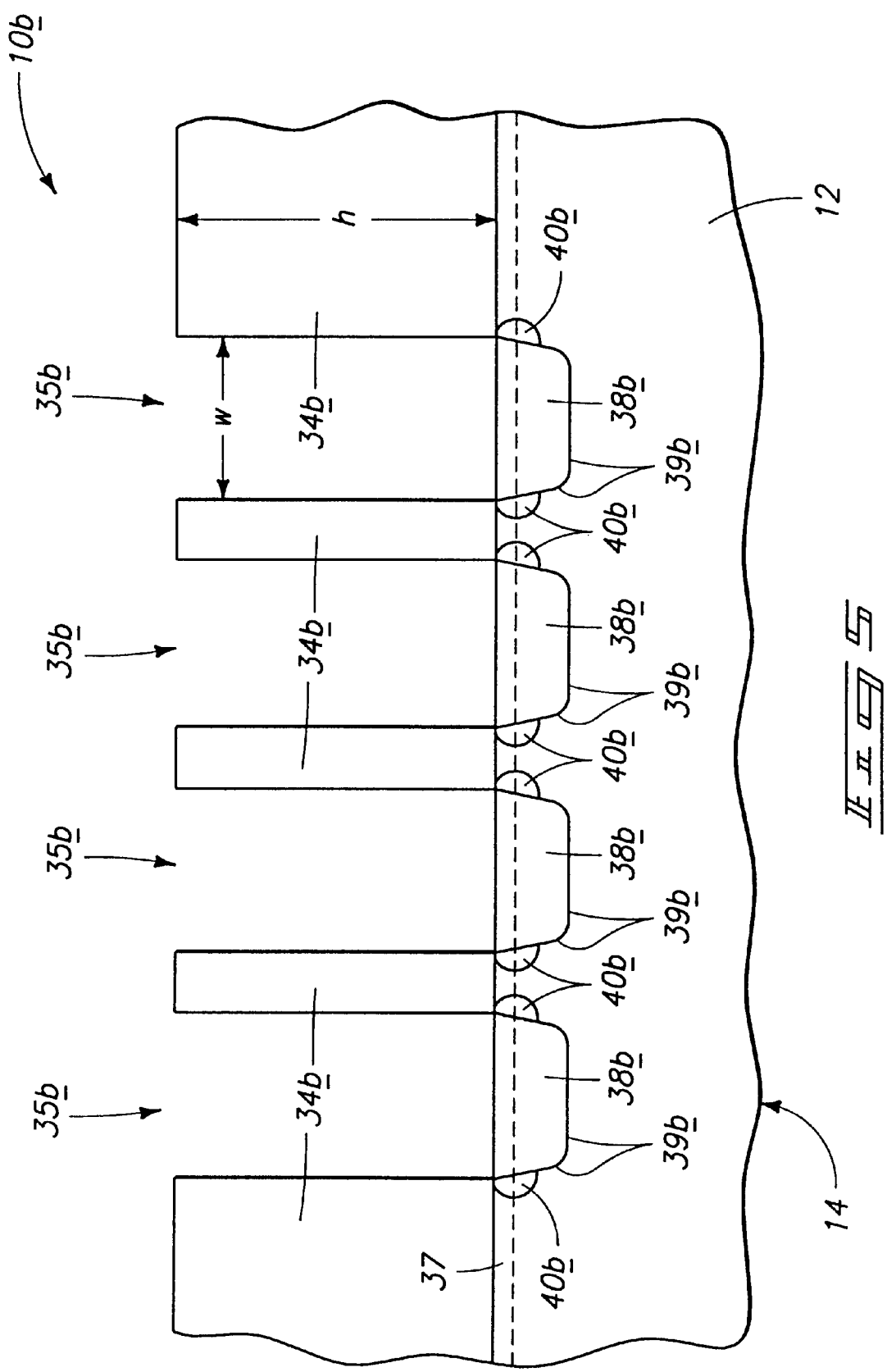
FIG. 5 is a view which is similar to the FIG. 4 view, but one which shows another preferred embodiment of the invention.

Referring to FIG. 5, an alternate preferred embodiment is shown. Like numbers from the above-described embodiment are utilized where appropriate, with differences being indicated with the suffix "b" or with different numerals. Here, masking material 34b is formed over the substrate and patterned to form the illustrated mask openings 35b. Mask openings 36 (FIG. 1) are also formed to accommodate formation of the above described source/drain regions. In this embodiment, mask openings 35b are suitably dimensioned so that, in concert with provision of the second conductivity type dopant, at least some portions of individual well contact diffusion regions 38b remain in physical contact with well region 14 after both the well contact diffusion regions and the FIG. 1 halo ion implant regions 40 are formed.

In one aspect, individual contact openings 35b have a height h, and the second conductivity type dopant regions 40 (FIG. 1) are formed through ion implantation of a suitable impurity at a desired angle away from vertical. The height h of the contact openings is selected to effectively block or interfere with the second conductivity type dopant so that, in a worst case, only dopant regions 40b are formed relative to the well contact diffusion regions 38b. An exemplary height h for the contact openings is about lm and an example doping angle away from vertical is 30°. Of course, other heights and doping angles can be used.

In another aspect, individual contact openings 35b have a width w, and the second conductivity type dopant regions 40 (FIG. 1) are formed through ion implantation of a suitable impurity at a desired angle away from vertical. An exemplary width w is about 0.5 $\mu$m and a suitable doping angle is about 30°. Together, selection of an appropriate width or widths for contact openings 35b and an appropriate doping angle at which the FIG. 1 source/drain diffusion regions are formed can ensure that reduced amounts of the second conductivity type dopant are received within well region 14.

In another aspect, both the height and width of the contact openings are selected so that, in concert with the desired angled ion implantation, only dopant regions 40b are formed. The illustrated dopant regions 40b have average dopant depths which are different, and preferably less than the dopant depths of the well contact diffusion regions.

Desirable advantages of the above-described aspects are that at least some portions of the individual well contact diffusion regions remain in substantial physical contact with the associated well region in which each is formed. Exemplary portions are illustrated at 39b. Accordingly, portions of the substrate within the mask openings are not doped by the second doping which facilitates subsequent electrical contact thereto.

Figure 6:
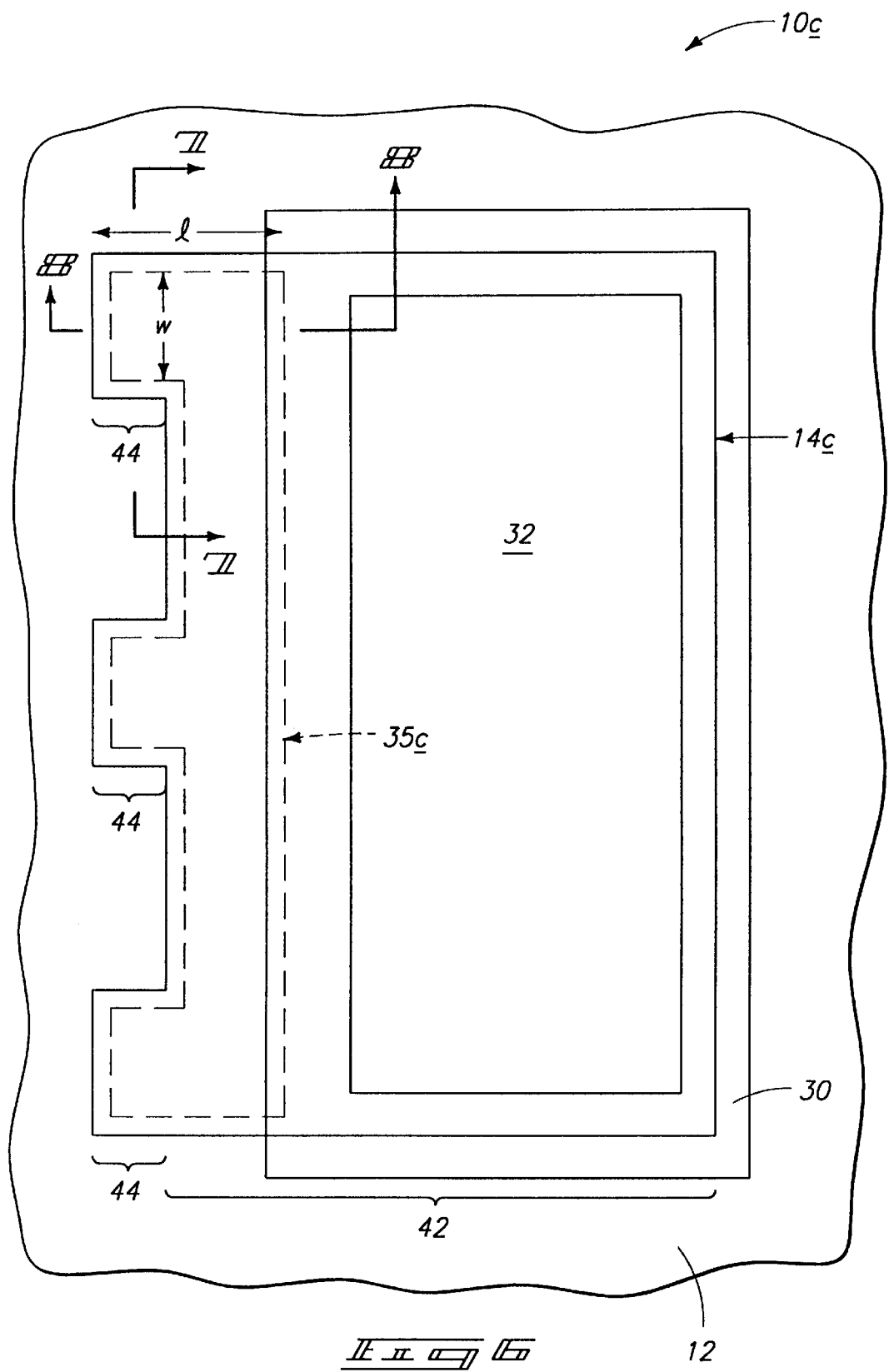
FIG. 6 is a top plan view of a semiconductor wafer fragment at one processing step in accordance with another preferred embodiment of the invention.

Referring to FIG. 6, an alternate preferred embodiment of the invention is set forth. Like numbers from the above-described embodiment are utilized where appropriate, with differences being indicated with the suffix "c" or with different numerals.

A first well region 14c is formed within substrate 12 and includes a main body portion 42. At least one extension portion 44 which is joined with main body portion 42 and extends generally away therefrom. In the illustrated and preferred embodiment, a plurality of extension portions 44 are provided, with three such extension portions being illustrated. As in the above-described embodiments, a masking layer 34c (FIGS. 7 and 8) is formed over the substrate and in a common masking step, a first mask opening 35c is formed over well region 14c and extension portions 44, and a second mask opening 36 (FIG. 1) is formed over well region 16. The mask openings over extension portions 44 define interconnected mask openings within first well region 14c. Alternately, a plurality of discrete mask openings similar to those shown at 35a in FIG. 3 can be formed relative to the extension portions.

According to one aspect of the invention, individual mask openings which extend over individual extension portions 44 have length (l) and width (w) dimensions which are different from one another. An exemplary length dimension l is about 0.8 $\mu$m with an exemplary width dimension being somewhat less than 0.8 $\mu$m. In addition, mask opening 35c comprises a height h.

Figure 7:
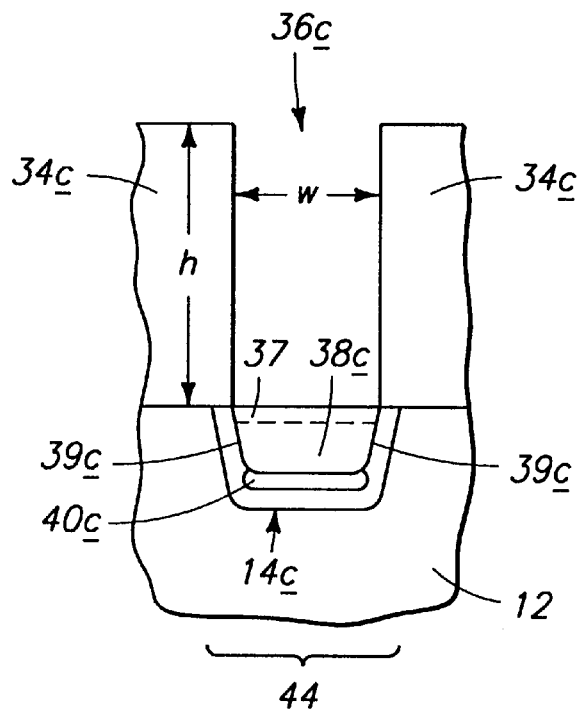
FIG. 7 is a view taken along line 7—7 in FIG. 6.
Figure 8:
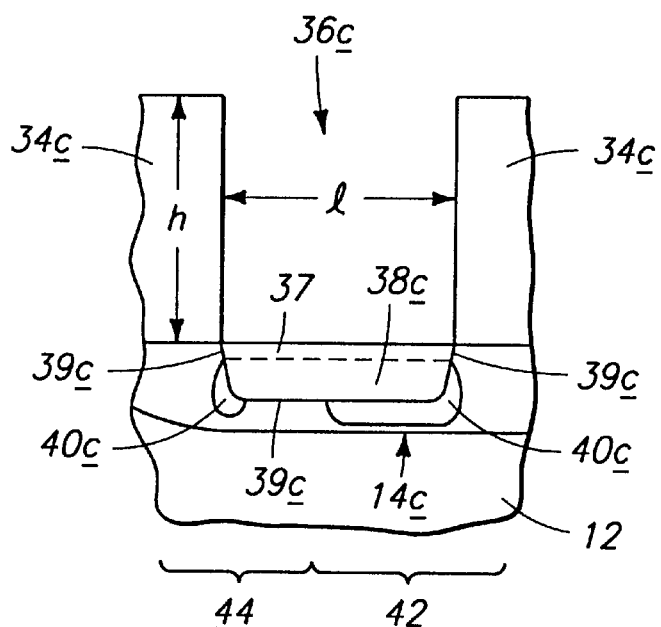
FIG. 8 is a view taken along line 8—8 in FIG. 6.

Referring to FIGS. 7 and 8 and with mask openings 35c in place, a desired first conductivity type dopant is provided into the substrate to form the well contact diffusion regions. An exemplary well contact diffusion region is shown at 38c within an exemplary extension portion 44. As in the above-described embodiments, the provision of the first conductivity type dopant into the substrate also desirably forms the FIG. 1 source/drain diffusion regions 38 relative to second mask opening 36 over well region 16.

A second conductivity type dopant is provided into the substrate and forms the above described halo ion implantation regions 40 of FIG. 1. As in the above-described embodiments and as a result of using a same or common masking step to form the exemplary source/drain diffusion regions 38 (FIG. 1), halo ion implantation or dopant regions 40 (FIG. 1), and well contact diffusion regions 38c (FIGS. 7 and 8), a certain amount of second conductivity type dopant can reach the substrate within well region 14c. According to a preferred aspect of the invention, the amount of undesired dopant which is ultimately provided into well region 14c is reduced by configuring the mask openings relative to well region 14c in a manner which, in connection with the provision or delivery of the second conductivity type dopant, reduces the amount of dopant which reaches the well region. Accordingly, the mask opening is configured to interfere with the second conductivity type doping in a manner which permits physical contact between portions 39c of the well contact diffusion region 38c and well region 14c after the second conductivity type doping is conducted. This will result in exemplary diffusion regions 40c which effectively leave at least some portion heavily doped region 38c in substantial physical contact with well region 14c.

The preferred manner of providing or delivering the second conductivity type dopant is to conduct an angled ion implantation of the dopant at a desired angle away from vertical. Adjusting the mask opening dimensions, including the length, width, and height thereof relative to the well region can, in concert with the preferred angled ion implantation, reduce the amount of second conductivity type dopant which ultimately reaches well region 14c, thus forming implant regions 40c. The dimensions of the mask opening as well as the desired angle at which the angled ion implantation takes place are similar to those described above.

In the above-described embodiments, a common masking step is utilized to provide source/drain diffusion regions and halo ion implantation or dopant regions relative to the source/drain regions within one well region of a substrate; and well contact diffusion regions within another well region of the substrate. The masking step preferably defines at least one mask opening over the substrate within which the well contact diffusion region is to be formed, and the mask opening is suitably dimensioned to reduce the amount of halo ion implantation dopant which ultimately reaches the substrate therebelow. According to one aspect, a plurality of mask openings are provided. According to another aspect, a suitably-dimensioned single mask opening is provided. In another aspect, a unique well region construction is provided with one or more complementary mask openings which is (are) configured to, in connection with the provision of the halo ion implantation dopant, block the amount of implantation dopant which ultimately reaches the substrate adjacent the well contact diffusion regions. Accordingly, at least some of the well contact diffusion region(s) remain in substantial contact with the well region after the doping of the substrate with the halo ion implantation dopant. Of course, the above-described first and second conductivity type doping steps can be performed in reverse order.

In one implementation, the halo ion implantation dopant defines a dopant region having an average dopant depth within the substrate which is different from that of the well contact diffusion region or the source/drain regions which are contemporaneously formed therewith. The dopant region average depth can be either greater or less than the average dopant depth of the well contact diffusion region. Of course, it is possible that only a negligible amount (or less) of halo ion implantation dopant reaches the subject well region.

In a preferred aspect, the above-mentioned source/drain diffusion regions and halo ion implantation regions constitute portions of NMOS circuitry which is formed relative to a p-type well or well region. As mentioned above, exemplary p-type wells or well regions can constitute an intrinsically p-type doped substrate, or p-type well regions which are individually formed or diffused into the substrate. Accordingly, the well contact diffusion regions, in this aspect, are provided relative to the n-type well regions which support the PMOS circuitry. It is to be understood, however, that the above-described implementation is an exemplary implementation only, and is not intended to limit application of the invention. Accordingly, the source/drain diffusion regions and halo ion implantation regions can be provided relative to PMOS devices which are formed over and/or within n-type wells or well regions, and the well contact diffusion regions can be formed relative p-type wells or well regions which support NMOS circuitry. Various dopant concentrations, implant doses, implant energies and the like, which are suitable for forming the above-described integrated circuitry will be understood by those of skill in the art. Exemplary processing parameters are set forth in U.S. Pat. No. 5,534,449, the disclosure of which is expressly incorporated herein by reference.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. Integrated circuitry comprising:
   a substrate;
   a first conductivity type well region having a main body portion received within the substrate; and
   the first well region having at least one well extension portion comprising the first conductivity type being joined with the main body portion and extending away therefrom.

2. The integrated circuitry of claim 1 further comprising at least one well contact diffusion region of the first conductivity type received within the at least one well extension portion and making physical contact with the first well region.

3. The integrated circuitry of claim 1 further comprising a plurality of said well extension portions.

4. The integrated circuitry of claim 1 further comprising:
   a plurality of said well extension portions; and
   a plurality of well contact diffusion regions, individual well contact diffusion regions being received within individual respective well extension portions.

5. The integrated circuitry of claim 1 wherein the well extension portion is rectangular in shape.

6. The integrated circuitry of claim 1 wherein the well extension portion includes a straight side.

7. The integrated circuitry of claim 1 wherein the well extension portion includes two straight sides.

8. The integrated circuitry of claim 1 wherein the well extension portion includes three straight sides.

9. Integrated circuitry comprising:
   a substrate;
   a first conductivity type well region received within the substrate and having a main body portion and at least one well extension portion which is joined with the main body portion and extends away therefrom;
   a second conductivity type well region received within the substrate;
   at least one conductive line disposed over the second well region and having associated source/drain regions received therein; and
   at least one well contact diffusion region of the first conductivity type received within the at least one well extension portion and making physical contact with the first well region.

10. The integrated circuitry of claim 9 further comprising a plurality of said well extension portions.

11. The integrated circuitry of claim 9 further comprising:
    a plurality of said well extension portions; and
    a plurality of well contact diffusion regions, individual well contact diffusion regions being received within individual respective well extension portions.

12. The integrated circuitry of claim 9, wherein:
    the first well region comprises a n-type well region;
    the second well region comprises a p-type well region; and
    the source/drain diffusion regions within the p-type well region and the at least one well contact diffusion region within the n-type well region comprise a same dopant material.

13. The integrated circuitry of claim 9 wherein the well extension portion is rectangular in shape.

14. The integrated circuitry of claim 9 wherein the well extension portion includes a straight side.

15. The integrated circuitry of claim 9 wherein the well extension portion includes two straight sides.

16. The integrated circuitry of claim 9 wherein the well extension portion includes three straight sides.

17. Integrated circuitry comprising:
    a substrate;
    a first conductivity type well region received within the substrate;
    a second conductivity type well region received within the substrate;
    an isolation oxide region received within the first conductivity type well region and laterally spaced from the second conductivity type well region;
    at least one conductive line disposed over the first well region and having associated source/drain regions received therein;
    at least one conductive line disposed over the second well region and having associated source/drain regions received therein;
    at least one well contact diffusion region of the first conductivity type received within and making physical contact with the first well region, the well contact diffusion region extending from the second conductivity type well region to the isolation oxide region; and a second conductivity type dopant region within at least the second well region having an average dopant depth within the substrate which is different from that of the source/drain regions received within the second well region.

18. The integrated circuitry of claim 17, wherein:

the first well region comprises a n-type well region;

the second well region comprises a p-type well region; and the source/drain diffusion regions within the p-type well region and the well contact diffusion region within the n-type well region comprise a same dopant material.

19. The integrated circuitry of claim 17 further comprising a plurality of said well contact diffusion regions.

20. Integrated circuitry comprising:

a substrate;

a first conductivity type well region received within the substrate;

a second conductivity type well region received within the substrate;

an isolation oxide region received within the first conductivity type well region and laterally spaced from the second conductivity type well region; and a plurality of spaced well contact diffusion regions received within and making physical contact with the first well region, individual of the well contact diffusion regions extending from the second conductivity type well region to the isolation oxide region.

21. The integrated circuitry of claim 20 wherein each of said plurality is of the same common shape.

22. The integrated circuitry of claim 20 wherein the common shape is rectangular.

23. The integrated circuitry of claim 20 wherein each of said plurality is of the same common shape and size.

24. The integrated circuitry of claim 20 wherein the common shape is rectangular.

25. Integrated circuitry comprising:

a substrate;

a first conductivity type well region received within the substrate;

a second conductivity type well region received within the substrate;

an isolation oxide region received within the first conductivity type well region and laterally spaced from the second conductivity type well region; and at least one well contact diffusion region received within and making physical contact with the first well region, the well contact diffusion region having a base and a pair of opposing sidewalls extending upwardly therefrom, the base being substantially covered with a discrete region of second conductivity type semiconductive material, neither of the sidewalls being covered with any discrete second conductivity type semiconductive material region.

26. Integrated circuitry comprising:

a substrate;

a first conductivity type well region received within the substrate;

a second conductivity type well region received within the substrate;

an isolation oxide region received within the first conductivity type well region and laterally spaced from the second conductivity type well region; and at least one well contact diffusion region received within and making physical contact with the first well region, the well contact diffusion region having a base and a pair of opposing sidewalls extending upwardly therefrom, the opposing sidewalls each being only partially covered by respective regions of second conductivity type semiconductive material.

27. The integrated circuitry of claim 26 wherein the base is not covered by any second conductivity type material region.

28. The integrated circuitry of claim 26 wherein the base is at least partially covered by a second conductivity type material region.

29. The integrated circuitry of claim 26 wherein the base is only partially covered by two spaced, discrete second conductivity type material regions.

* * * * *

UNITED STATES PATENT AND TRADEMARK OFFICE
CERTIFICATE OF CORRECTION

PATENT NO. : 6,215,151 B1  
DATED : April 10, 2001  
INVENTOR(S) : Zhiqiang Wu, et al.

It is certified that error appears in the above-identified patent and that said Letters Patent is hereby corrected as shown below:

Column 5,
Line 14, replace "1m" with -- 1 um --.

Signed and Sealed this

Sixteenth Day of October, 2001

Attest:

NICHOLAS P. GODICI
Attesting Officer
Acting Director of the United States Patent and Trademark Office